United States Patent [19]

Musser

[11] Patent Number: 4,461,672

[45] Date of Patent: Jul. 24, 1984

[54] PROCESS FOR ETCHING TAPERED VIAS IN SILICON DIOXIDE

[75] Inventor: Mary E. Musser, Dallas, Tex.

[73] Assignee: Texas Instruments, Inc., Dallas, Tex.

[21] Appl. No.: 442,826

[22] Filed: Nov. 18, 1982

[51] Int. Cl.³ .................... H01L 21/306; B44C 1/22; C03C 15/00; C03C 25/06

[52] U.S. Cl. .................... 156/644; 156/643; 156/646; 156/651; 156/653; 156/657; 156/659.1; 156/662; 204/192 E; 427/90

[58] Field of Search ............... 156/643, 646, 644, 652, 156/653, 657, 659.1, 662, 651; 204/192 E, 164; 427/38, 39, 88, 89, 90; 252/79.1

[56] References Cited

U.S. PATENT DOCUMENTS

| | | | |
|---|---|---|---|
| 3,880,684 | 4/1975 | Abe | 156/659.1 X |
| 4,076,575 | 2/1978 | Chang | 156/656 |
| 4,184,909 | 1/1980 | Chang | 156/646 X |
| 4,213,818 | 7/1980 | Lemons et al. | 156/646 X |
| 4,293,375 | 10/1981 | Neukomm | 156/646 X |

Primary Examiner—William A. Powell

Attorney, Agent, or Firm—Douglas A. Lashmit; Melvin Sharp; N. Rhys Merrett

[57] ABSTRACT

A method for etching tapered apertures in the insulating layer between metal layers in an integrated circuit having a multilevel interconnection system. In one embodiment a thin layer of polysilicon is formed on the interlevel oxide layer followed by deposition of a photoresist layer thereon. A pattern of apertures is formed in the resist layer which is then exposed to a selective silicon etchant to form an opening in the polysilicon layer extending to the surface of the oxide layer. The polysilicon and oxide layers are then etched with a nonselective etchant. During the oxide etch the polysilicon is etched laterally, thereby widening the apertures and producing a taper in the aperture sidewalls as the etch proceeds. The magnitude of the taper is related to the thickness of the polysilicon layer. In another embodiment wherein the oxide layer directly overlies a silicon region, the polysilicon and oxide layers are first exposed to a nonselective etchant to etch partially through the oxide layer. The tapered via is completed by etching through the oxide layer with a selective etchant.

10 Claims, 8 Drawing Figures

PROCESS FOR ETCHING TAPERED VIAS IN SILICON DIOXIDE

BACKGROUND OF THE INVENTION

This invention relates to the fabrication of apertured insulation films, and more particularly to the fabrication of integrated circuits having such films as insulation between metallization levels.

The advent of very large scale integrated circuit technology places increasing demands on multilevel interconnection systems. As the minimum features become smaller, e.g., two micron gates in 64K random access memories, it has become necessary to form more than one level of metallic interconnections requiring adequate electrical insulation or isolation between the various levels of contacts at crossover points and ohmic connection between the various levels through apertures in the insulating layers. The feed-through holes, or vias, in the insulating layer between metal levels are required to have tapered sidewalls in order to minimize step-coverage problems and thus enhance yield and reliability.

One method for producing tapered apertures or vias in silicon dioxide is known as the "resist erosion" process wherein a photoresist is formed on an oxide layer. This process is described in the following articles: J. A. Bondur and H. A. Clark, "Plasma Etching for SiO$_2$ Profile Control", *Solid State Technology*, April 1980, pp. 122-128; N. S. Viswanathan, "Simulation of Plasma-Etched Lithographic Structures", *Journal of Vacuum Science Technology*, vol. 16, No. 2, March-April 1979, pp. 388-390. Tapered apertures are formed in the resist extending to the oxide which is then exposed to a nonselective etchant. As the resist and the oxide are etched the opening in the resist widens which produces an aperture in the oxide layer having tapered sidewalls. This is essentially a pattern transfer process since the initial taper in the resist is reproduced in the oxide layer, assuming a one to one resist-oxide etch ratio. A disadvantage of this method is that the thickness of the resist and the initial taper of the aperture therein must be precisely controlled in order to produce an aperture in the oxide having the required taper. Further, the repeatability of this process is dependent upon the extent to which the composition of the resist can be controlled from batch to batch. It is also difficult to obtain tapered openings less than about two microns because a correspondingly thinner layer of resist is required which may be insufficient to protect the underlying layer.

SUMMARY OF THE INVENTION

The present invention overcomes these and other disadvantages by providing an improved method for etching tapered apertures in the insulating layer between metal layers in an integrated circuit having a multilevel interconnection system.

In one embodiment of the present invention a thin layer of polysilicon is formed on the interlevel oxide layer followed by deposition of a photoresist layer thereon. A pattern of apertures is formed in the resist corresponding to the required connection points between metal levels. The apertured resist is exposed to an isotropic etchant which is nonselective as between oxide and silicon. During the oxide etch the polysilicon is etched laterally, thereby widening the apertures and producing a taper in the aperture sidewalls as the etch proceeds. The magnitude of the sidewall taper is determined by the thickness of the polysilicon layer and/or the composition of the etchant.

In another embodiment of the invention the apertured resist is first exposed to an etchant selective to silicon to open a contact window in the polysilicon layer extending to the surface of the oxide layer, followed by exposure to a nonselective etchant as in the previous embodiment.

In yet another embodiment a via is formed in an oxide layer directly overlying a silicon region by etching partially through the thin polysilicon layer and the oxide layer with a nonselective etchant, and then etching through the remaining portion of the oxide layer with an etchant selective as to oxide.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawings wherein:

DETAILED DESCRIPTION OF THE INVENTION

Figure 1:
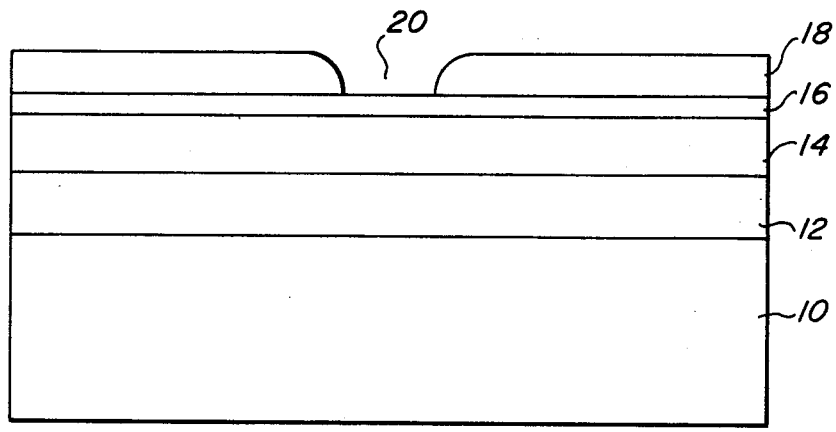
FIGS. 1-4 are cross-sectional views of an integrated circuit device showing the device at various stages of fabrication according to one embodiment of the present invention.

Referring now to the drawings there is shown in FIG. 1 a portion of a semiconductor substrate 10 such as silicon having an aluminum or other metal layer 12 formed thereon. An interlevel insulation layer 14 of silicon dioxide on layer 12 has a layer 16 of polysilicon and a photoresist layer 18 deposited thereon. A pattern of apertures 20 (one shown) is formed in resist layer 18 by any known method, the apertures 20 corresponding to the required interlevel vias in oxide layer 14.

Figure 2:
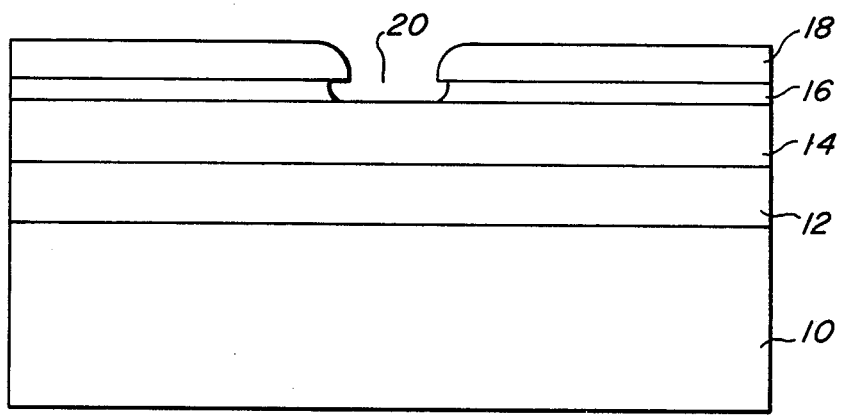
Figure 3:
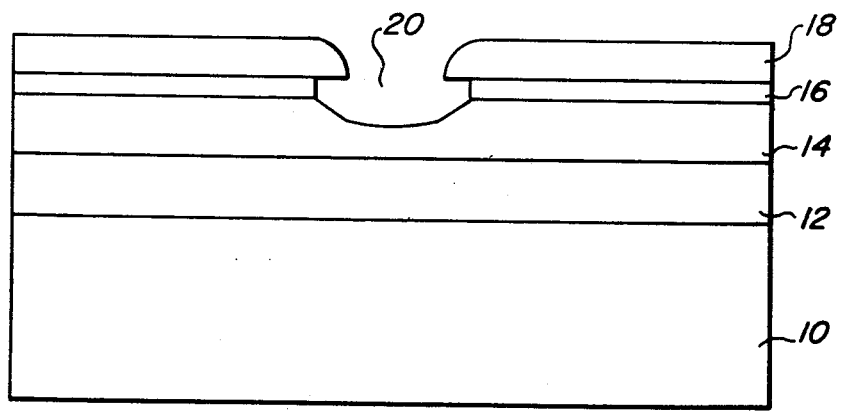
Figure 4:
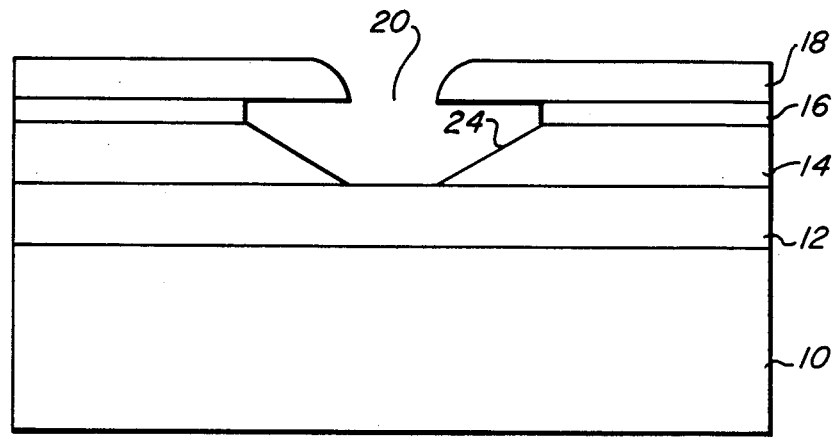
Figure 5:
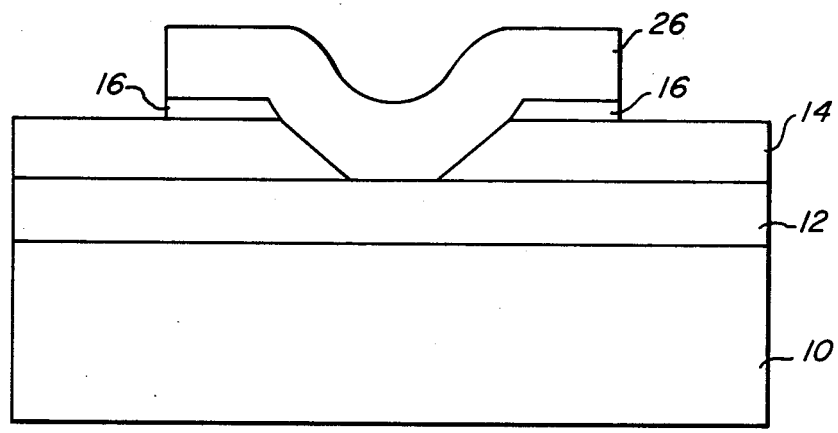
FIG. 5 is a cross-sectional view of a completed device showing the second level metallization.

The apertured resist layer 18 is then exposed to a suitable etchant, for example a CF$_4$ plasma etch, that is nonselective as between polysilicon and silicon dioxide. FIG. 2 shows polysilicon layer 16 etched down to the surface of oxide layer 14. As the etching proceeds, as shown in FIG. 3, and polysilicon layer 16 is etched laterally, thus widening aperture 20. As the oxide 14 under polysilicon 16 is exposed it also begins to etch. Because different areas of oxide 14 are exposed to the etchant for different lengths of time, a taper is produced in the sidewalls 24 of aperture 20, as shown in FIG. 4. Referring to FIG. 5, the device is completed by removing resist 18 and depositing a second metal layer 26 over aperture 20.

According to another aspect of the present invention, different tapers, i.e., different slopes of sidewalls 24, may be obtained by changing the thickness of polysilicon layer 16 and/or changing the selectivity of the etchant so that polysilicon 16 and silicon dioxide 14 are etched at different rates. For a given etchant, increasing the thickness of polysilicon layer 16 will decrease the slope of sidewalls 24 with respect of the horizontal as viewed in the drawings. A similar result is obtained by modifying the etchant so that polysilicon 16 etches at a greater rate than silicon dioxide 14.

In another embodiment of the invention apertured resist 18, referring to FIG. 1, is first exposed to an etchant selective for silicon, i.e., the etch rate for silicon is substantially greater than the etch rate for silicon dioxide, for a length of time sufficient to open a contact window through layer 16 to the surface of oxide layer 14. An anisotropic selective etch is preferred in order to provide an opening in layer 16 substantially the same size as the original aperture 20 in resist 18. A nonselective etchant is then used as described hereinabove until a tapered aperture 20 is formed in layer 14.

Figure 6:
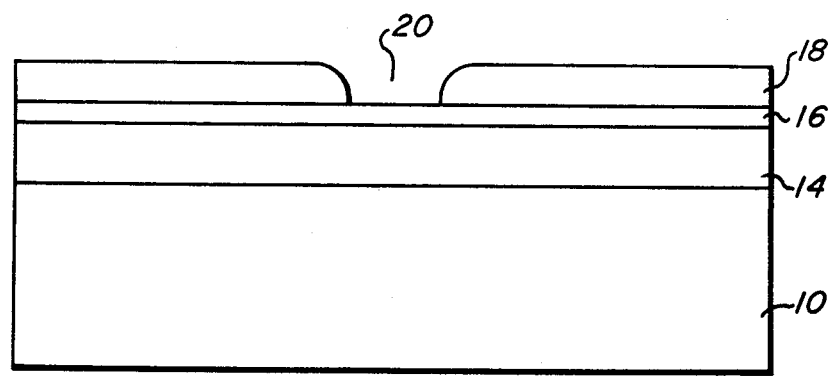
FIGS. 6-8 are cross-sectional views of an integrated circuit device illustrating a process according to a second embodiment of the present invention.
Figure 7:
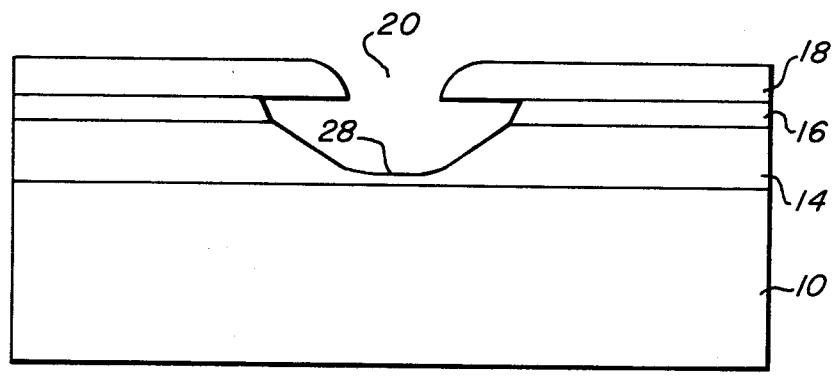
Figure 8:
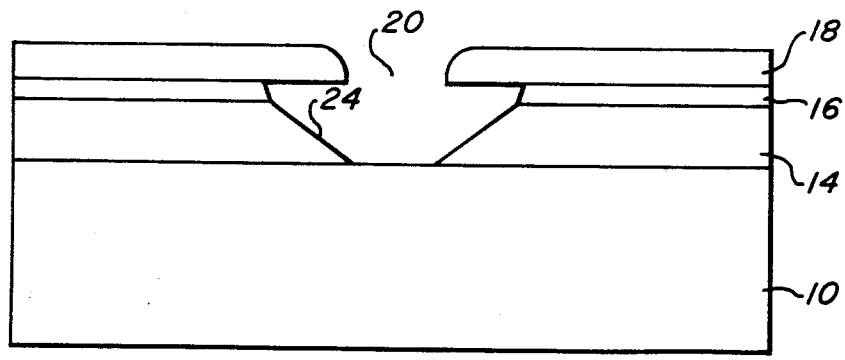

In yet another embodiment of the invention an aperture is formed in an oxide layer 14 directly overlying semiconductor substrate 10. Referring to FIGS. 6-8, a polysilicon layer 16 followed by an apertured resist layer 18 are formed as in the previous embodiments described above. The apertured resist 18 is then exposed to a nonselective silicon-silicon dioxide etchant for a length of time sufficient to etch substantially, but not completely, through layer 14 leaving a thin oxide region 28 thereon as shown in FIG. 7. An etchant selective for silicon dioxide is then used to etch through region 28 to the surface of substrate 10. An anisotropic etchant will remove region 28 without unduly rounding the sidewalls 24 of aperture 20. In each of the foregoing embodiments, the polysilicon between the interconnection leads of the second metal layer 26 may be removed by a highly selective polysilicon etchant.

In a specific example of the present process a 10,000 Angstrom silicon dioxide layer 14 was deposited on a substrate 10 having a patterned metal interconnection layer 12 thereon. Polysilicon layer 16 was grown to a thickness of about 2,000 Angstroms, followed by a layer 18 of resist deposited to a thickness of about 10,000 Angstroms. Circular apertures 20 approximately two microns in diameter were formed in resist 18 which was then exposed to a polysilicon plasma etchant composed of $CF_4$ at 200 cc/min., Ar at 200 cc/min., and $O_2$ at 10 cc/min. The etch time was approximately 7 minutes at a power level of 150 watts, a pressure of 1.5 torr, and a temperature of about 80 degrees C. This was followed by an oxide etch for about 10 minutes. The same $CF_4$ etchant was used, but the pressure and power levels were raised to about 2.4 torr and 500 watts so that the etchant was substantially nonselective as between polysilicon and silicon dioxide. A taper of about 20 degrees with respect to the horizontal was thereby formed in oxide 14. As described above, a smaller sidewall taper, i.e., a larger sidewall angle with respect to the horizontal, can be obtained by depositing a correspondingly thinner layer of polysilicon 16 between oxide 14 and resist 18.

Thus, the present invention provides a method for forming tapered vias in the interlevel oxide layers of a multilevel metal system wherein the magnitude of the taper is determined by selecting the thickness of a polysilicon masking layer deposited on the oxide layer, and/or selecting an etchant with the appropriate etch ratios.

Obviously, many modifications and variations of this invention are possible in the light of the above teachings. It is therefore to be understood that within the scope of the appended claims the invention may be practiced otherwise than as specifically described.

What is claimed is:

1. A method for fabricating a semiconductor device comprising the steps of:
   forming an insulating layer on a surface of a semiconductor body;
   depositing a semiconductor layer of a predetermined thickness on said insulating layer;
   selectively masking said semiconductor layer with an apertured resist;
   exposing said device to a selective etchant to form an opening in said semiconductor layer extending to the surface of said insulating layer; and
   exposing said device to a nonselective etchant for etching said semiconductor layer and said insulating layer at predetermined rates, whereby tapered apertures are formed in said insulating layer.

2. The method of claim 1, wherein the magnitude of said taper is determined by selecting the appropriate thickness of said semiconductor layer.

3. The method of claim 2 wherein said insulating layer comprises silicon dioxide and said semiconductor layer comprises polysilicon.

4. A method for fabricating a semiconductor device comprising the steps of:
   depositing a layer of silicon dioxide on a silicon substrate, said substrate including a patterned conducting layer thereon;
   depositing a layer of polysilicon of a predetermined thickness on said silicon dioxide layer;
   selectively masking said polysilicon layer with an apertured resist;
   exposing said device to a selective etchant to form an opening in said polysilicon layer extending to the surface of said silicon dioxide layer; and
   exposing said device to a nonselective etchant for etching said polysilicon layer and said silicon dioxide layer at predetermined rates, whereby tapered apertures are formed in said silicon dioxide layer extending to said conducting layer.

5. The method of claim 4 wherein said predetermined etch rates are selected so that the etch rate of polysilicon is substantially equal to the etch rate of silicon dioxide.

6. The method of claim 5 wherein the magnitude of said taper is determined by selecting the appropriate thickness of said polysilicon layer.

7. The method of claim 6, further including the steps of:
   removing said apertured resist;
   forming a second patterned metal layer overlying said polysilicon layer and said aperture, whereby an electrical connection is established between said second metal layer and said first metal layer through said aperture.

8. A method for fabricating a semiconductor device comprising the steps of:
   forming an insulating layer on a surface of a semiconductor body;
   depositing a semiconductor layer of a predetermined thickness on said insulating layer;
   selectively masking said semiconductor layer with an apertured resist;
   exposing said insulating layer to a first etchant nonselective as between said semiconductor and said insulator for a length of time sufficient to etch partially through said insulating layer, whereby a thin insulating region remains over said substrate; and exposing said insulating layer to a second etchant selective for said insulator to etch through said thin insulating region to form an aperture in said insulating layer having tapered sidewalls.

9. The method of claim 8 wherein the magnitude of the taper of said aperture sidewalls is determined by selecting the appropriate thickness of said semiconductor layer.

10. The method of claim 9 wherein said insulating layer comprises silicon dioxide and said semiconductor layer comprises polysilicon.

* * * * *